United States Patent
Yoon et al.

(10) Patent No.: US 8,127,395 B2
(45) Date of Patent: Mar. 6, 2012

(54) APPARATUS FOR ISOLATED BEVEL EDGE CLEAN AND METHOD FOR USING THE SAME

(75) Inventors: Hyungsuk Alexander Yoon, San Jose, CA (US); Andrew D. Bailey, III, Pleasanton, CA (US); Jason A. Ryder, Oakland, CA (US); Mark H. Wilcoxson, Oakland, CA (US); Jeffrey G. Gasparitsch, Fremont, CA (US); Randy Johnson, Newark, CA (US); Stephan P. Hoffmann, Fremont, CA (US)

(73) Assignee: Lam Research Corporation, Fremont, CA (US)

(*) Notice: Subject to any disclaimer, the term of this patent is extended or adjusted under 35 U.S.C. 154(b) by 223 days.

(21) Appl. No.: 11/429,574

(22) Filed: May 5, 2006

(65) Prior Publication Data
US 2009/0113656 A1    May 7, 2009

(51) Int. Cl.
*B08B 7/00* (2006.01)
(52) U.S. Cl. ............... 15/302; 134/6; 134/902
(58) Field of Classification Search .............. 15/21.1, 15/302, 308, 401, 52, 322, 256.2, 309.2
See application file for complete search history.

(56) References Cited

U.S. PATENT DOCUMENTS

| | | | | |
|---|---|---|---|---|
| 2,751,616 A * | 6/1956 | Turner, Jr. | ........................ | 15/77 |
| 3,233,272 A * | 2/1966 | Pambello | ........................ | 15/182 |
| 3,278,972 A * | 10/1966 | Hudson | ........................ | 15/308 |
| 3,766,593 A * | 10/1973 | Becker et al. | ........................ | 15/308 |
| 3,780,391 A * | 12/1973 | Leenhouts | ........................ | 15/1.51 |
| 3,939,825 A * | 2/1976 | Krummenacher | ........................ | 601/104 |
| 3,942,889 A * | 3/1976 | Kurita et al. | ........................ | 399/354 |
| 3,965,524 A * | 6/1976 | Kurita et al. | ........................ | 15/308 |
| 4,107,810 A * | 8/1978 | Varni et al. | ........................ | 15/97.1 |
| 4,205,911 A * | 6/1980 | Dole | ........................ | 399/355 |
| 4,304,026 A * | 12/1981 | Borostyan | ........................ | 15/308 |
| 4,324,015 A * | 4/1982 | Head | ........................ | 15/52.1 |
| 4,364,660 A * | 12/1982 | Oda | ........................ | 399/345 |
| 4,370,356 A | 1/1983 | Bok et al. | | |
| 4,531,250 A * | 7/1985 | Watanabe | ........................ | 15/104.12 |
| 4,566,473 A * | 1/1986 | Hyman | ........................ | 132/120 |
| 4,569,098 A * | 2/1986 | Kawabe | ........................ | 15/114 |
| 4,639,813 A * | 1/1987 | Uno | ........................ | 360/128 |
| 4,851,880 A * | 7/1989 | Ziegelmuller et al. | ........................ | 399/355 |
| 4,856,133 A * | 8/1989 | Sanchez | ........................ | 15/29 |

(Continued)

OTHER PUBLICATIONS

PCT International Search Report—PCT /US07/10929, dated Nov. 6, 2008.

*Primary Examiner* — Lee D Wilson
*Assistant Examiner* — Jamal Daniel
(74) *Attorney, Agent, or Firm* — Martine Penilla Group, LLP

(57) ABSTRACT

An apparatus, system and method for cleaning a substrate edge include a bristle brush unit that cleans bevel polymers deposited on substrate edges using frictional contact in the presence of cleaning chemistry. The bristle brush unit is made up of a plurality of outwardly extending vanes and is mounted on a rotating shaft. An abrasive material is distributed throughout and within the outwardly extending vanes of the bristle brush unit to provide the frictional contact. The bristle brush unit cleans the edge of the substrate by allowing frictional contact of the plurality of abrasive particles with the edge of the substrate in the presence of fluids, such as cleaning chemistry, to cut, rip and tear the bevel polymer from the edge of the substrate.

14 Claims, 6 Drawing Sheets

U.S. PATENT DOCUMENTS

| | | | |
|---|---|---|---|
| 4,903,084 A * | 2/1990 | Baltrus et al. | 399/355 |
| 5,150,769 A * | 9/1992 | Major et al. | 184/31 |
| 5,228,022 A * | 7/1993 | Compton et al. | 369/72 |
| 5,357,328 A * | 10/1994 | Lundy | 399/175 |
| 5,688,402 A * | 11/1997 | Green et al. | 210/355 |
| 5,715,565 A * | 2/1998 | Kern | 15/302 |
| 5,839,144 A * | 11/1998 | Willner | 15/36 |
| 5,894,622 A * | 4/1999 | Manfredi et al. | 15/102 |
| 5,901,399 A | 5/1999 | Moinpour et al. | |
| 5,903,951 A * | 5/1999 | Ionta et al. | 15/180 |
| 5,966,766 A | 10/1999 | Shipley et al. | |
| 6,098,454 A * | 8/2000 | Ghorashi et al. | 73/160 |
| 6,167,583 B1 | 1/2001 | Miyashita et al. | |
| 6,186,873 B1 * | 2/2001 | Becker et al. | 451/54 |
| 6,584,636 B2 * | 7/2003 | Schlem | 15/104.92 |
| 6,754,929 B2 * | 6/2004 | Fichter | 15/114 |
| 6,837,777 B2 | 1/2005 | Ziemins et al. | |
| 7,051,396 B2 * | 5/2006 | Levesque | 15/230.16 |
| 7,140,065 B2 * | 11/2006 | Boos et al. | 15/302 |
| 2003/0145622 A1 * | 8/2003 | Kawasaki et al. | 62/503 |
| 2004/0123417 A1 * | 7/2004 | Worwag | 15/387 |

* cited by examiner (Top view of the substrate with a notch and bristle brush)

APPARATUS FOR ISOLATED BEVEL EDGE CLEAN AND METHOD FOR USING THE SAME

FIELD OF THE INVENTION

The present invention relates generally to semiconductor substrate processing, and more particularly, to a method and apparatus for cleaning substrate edges before, during and after fabrication operations.

DESCRIPTION OF THE RELATED ART

Semiconductor chip fabrication is a complicated process that involves a coordinated series of fabrication operations. These operations can be broadly characterized to include steps such as layering, patterning, etching, doping, chemical mechanical polishing (CMP), etc. It is well known that during the various steps of these operations, the surfaces, edges, bevels and notches of the semiconductor substrate (wafer) become contaminated with a layer of residue comprised of particulates, organic materials, metallic impurities, etc. There is a need to clean the surface of the substrate of these contaminated particles in order to maximize the yield of contaminant-free chips.

Some examples of operations that may result in unwanted substrate contamination include plasma etching and CMP. During plasma etching, the substrate is placed in a reaction chamber and exposed to charged plasma which physically or chemically removes layers of material off the substrate surface. After the etching process is complete, a post-etch cleaning step follows whereby contaminant residue deposited on the substrate during the etching process is removed. Typically, this involves the application of chemistry to the front and back surfaces of the substrate followed by rinsing and drying. When using the optimal chemistry and tool settings, this post-etch cleaning step significantly removes or reduces the amount of post-etch contaminant residue on the substrate.

However, one type of post-etch residue that does not readily lend itself to removal by conventional post-etch chemical-based cleaning methods is organic 'bevel' polymer residue found on the substrate bevel edge, notch, and the portion of the backside of the substrate. Bevel polymers have unique properties, in that they are relatively inert and adhere to each other and to the substrate surface with a strong bond that is relatively hard to break. As semiconductor fabricators look towards shrinking the edge exclusion zone of the semiconductor substrate to increase the substrate's chip yield, it is becoming increasingly important to remove this type of residue.

Mechanical cleaning tools such as brush scrubbers and edge scrubbers have been used with various degrees of success. Brush scrubbing and edge scrubbing tools use soft materials such as polyvinyl alcohol ('PVA') that are designed to prevent scratching of the substrate surface. These tools are effective at removing some of the contaminants and certain types of residue on the front and back side of the substrate but are not capable of breaking the strong bond of the bevel polymers deposited on the substrate edges and notch.

In view of the foregoing, there is a need for an apparatus and method for enhancing substrate edge cleaning.

SUMMARY

The present invention fills the need by providing an improved apparatus for cleaning bevel polymer deposited on a substrate edge. It should be appreciated that the present invention can be implemented in numerous ways, including as an apparatus, a system and a method. Several inventive embodiments of the present invention are described below.

In one embodiment, an apparatus for cleaning an edge of a substrate is disclosed. The apparatus includes a housing to receive the edge of the substrate. A bristle brush unit with a plurality of outwardly extending vanes is located within the housing. The bristle brush unit is mounted on a rotating shaft within the housing and aligned such that the outwardly extending vanes contact the edge of the substrate when rotating, for efficient cleaning.

In another embodiment, a system for cleaning an edge of a substrate is disclosed. The system includes a substrate supporting device to support the substrate. The system also includes a bristle brush applicator. The bristle brush applicator includes a housing configured to receive the edge of the substrate and a bristle brush unit to aid in the substrate edge cleaning. The bristle brush unit has a plurality of outwardly extending vanes and is mounted on a rotating shaft. The bristle brush unit is aligned inside the housing such that the outwardly extending vanes make contact with the edge of the substrate when rotating.

In yet another embodiment, a method is disclosed for cleaning an edge of a substrate. The method includes receiving the edge of the substrate within a housing. A bristle brush unit within the housing is rotated in a direction opposite to an angle of curvature of the outwardly extending vanes. The rotating bristle brush unit assists in cleaning the edge of the substrate.

Other advantages of the present invention will become apparent from the following detailed description, taken in conjunction with the accompanying drawings, illustrating the principles of the present invention.

BRIEF DESCRIPTION OF THE DRAWINGS

The invention may best be understood by reference to the following description taken in conjunction with the accompanying drawings. These drawings should not be taken to limit the invention to the preferred embodiments, but are for explanation and understanding only.

DETAILED DESCRIPTION

Several embodiments for an improved and more effective substrate edge cleaning apparatus, system and method will now be described. It will be obvious, however, to one skilled in the art, that the present invention may be practiced without some or all of these specific details. In other instances, well known process operations have not been described in detail in order not to unnecessarily obscure the present invention.

Substrate edge cleaning apparatus, systems and methods are very important to the ultimate quality of the resulting semiconductor products, e.g., microchips. In the present invention, the bevel polymers deposited on the substrate edges are treated with mechanical and chemical scrubbing that cuts, tears and removes the bevel polymers from the substrate edge.

In this document, a substrate is used to refer to a thin slice of a semi-conductor material (usually silicon), from which microchips are made. The substrate can also be a flat panel substrate, which typically takes on a rectangular or square shape.

Figure 1:
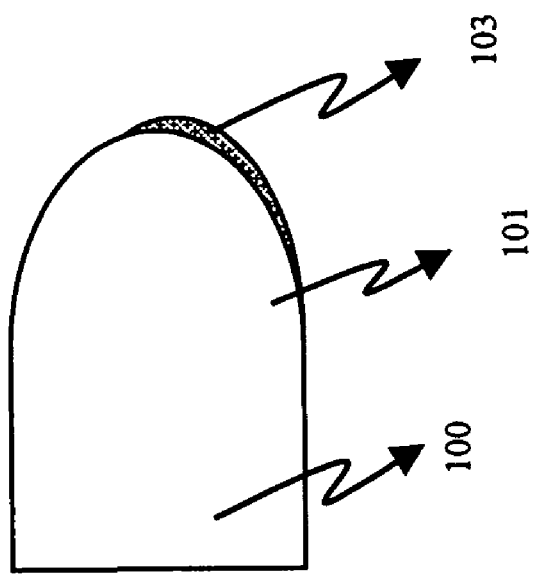
FIG. 1 is a simplified schematic diagram illustrating an edge of a substrate before a cleaning process is applied to the substrate, in accordance with an embodiment of the invention.
Figure 1:
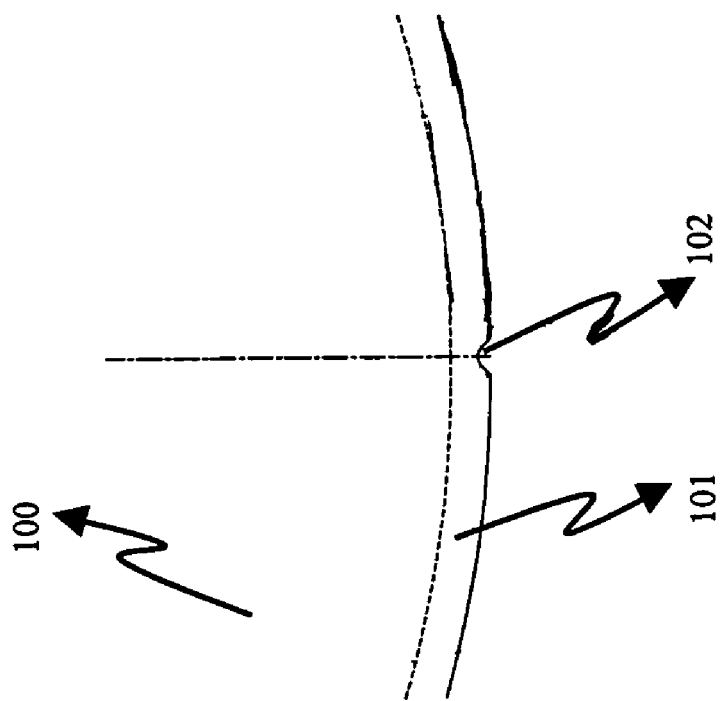

FIG. 1 shows a substrate 100 having an edge 101 and a notch 102. As shown, the bevel polymer 103 forms in the notch 102 and on the outer curvature and back underside curvature of the edge 101 with more concentration on the back underside curvature of the edge 101 of the substrate 100. This concentration of the bevel polymer 103 is common due to the nature of the fabrication operations and the placement of the substrate 100 in various tools during different stages of the fabrication process.

Figure 2:
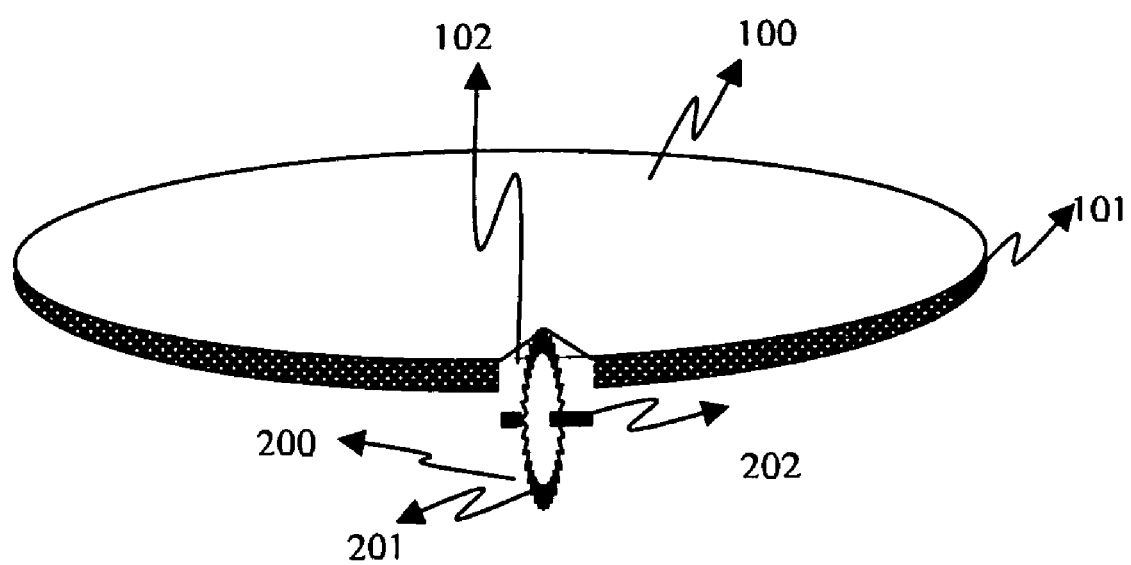
FIG. 2 is a simplified schematic diagram illustrating a substrate with a bristle brush unit received within a notch of the substrate, in accordance with an embodiment of the invention.

FIG. 2 illustrates a simplified schematic diagram of a substrate 100 with the edge 101 and notch 102 of the substrate 100 being placed in contact with a bristle brush unit 200 mounted on a rotating shaft 202. When rotated around the rotating shaft's axis, the vanes of the bristle brush unit 200 contacts the substrate 100 to clean the edge 101 and notch 102 of the substrate 100. Although FIG. 2 illustrates a single bristle brush unit 200 mounted on the rotating shaft 202, a plurality of bristle brush units 200 could be mounted on the rotating shaft 202 to cover a wider cleaning area and aid in efficient cleaning. The bristle brush unit 200 efficiently cleans the edge 101 of the substrate 100 and any hard-to-reach areas of the substrate 100, such as the notch 102, where the bevel polymer 103 is deposited.

Figure 3:
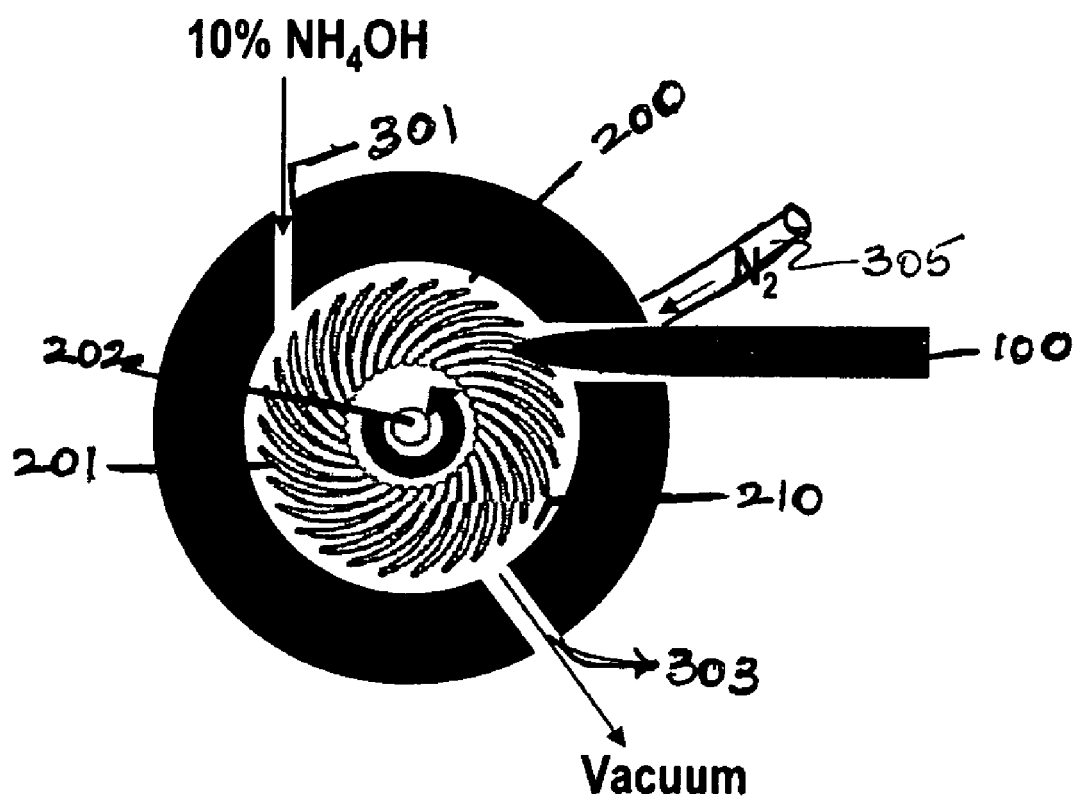
FIG. 3 illustrates a cross-sectional view of a cavity in a housing containing the bristle brush unit, in accordance with an embodiment of the invention.

FIG. 3 illustrates a cross-sectional view of a cavity 210 in a housing 205 containing a bristle brush unit 200, in an embodiment of the invention. The housing 205 is used to: a) hold the bristle brush unit 200, and b) receive the edge 101 of the substrate 100 for cleaning. The housing 205 may be made of a chemically resistant material such as PolyVinylidine DiFluoride (commonly marketed as KYNAR), Polytetrafluoroethylene (commonly marketed as TEFLON), Polypropolene, Polyethylene Terephthalate (PET), polyvinyl chloride (PVC), Acrylic, Polyetheretherketone (PEEK), Delrin, Acetal, or Polyphenylene Sulfide (PPS). Other chemically resistant materials may be used so long as the material is compatible with any cleaning chemistries provided herein. The cavity 210 in the housing 205 is a hollow area in which the bristle brush unit 200 is located. The bristle brush unit 200 is oriented so that portions of the outwardly extending vanes (vanes) 201 that make up the bristle brush unit 200 come in contact with the substrate 100 for efficient cleaning.

As illustrated in FIG. 3, the bristle brush unit 200 inside the cavity 210 in the housing 205 is mounted on a rotating shaft 202. The vanes 201 of the bristle brush unit 200 are placed in contact with the surface of the substrate 100 and as the bristle brush unit 200 rotates, the vanes 201 will hit the underside surface edge of the substrate 100 to forcibly abrade any deposited layer. The bristle brush unit 200 enables the delivery of fluids, such as a cleaning chemistry that aid in substrate edge cleaning. In one embodiment, the bristle brush unit 200, including the vanes 201, is made up of a porous material such as nylon with 1 micron alumina impregnated in the nylon. It should be noted that the bristle brush unit 200 is configured within the housing 205 such that the bristle brush unit 200 can be removed and replaced, thus bristle brush unit 200 is a consumable item.

In one embodiment, an abrasive material is distributed within and throughout the bristle brush unit 200, including the vanes 201, to provide greater frictional contact and apply more abrasive force to the bevel polymer 103 on the surface of the substrate 100 during the cleaning process. The distribution of the abrasive material can be random or can be uniform. The amount and nature of abrasive material distributed throughout the bristle brush unit and the vanes 201 may depend on the nature of the bevel polymer deposit and the amount of frictional contact that is needed to scrape the bevel polymer from the edge 101 and notch 102 of the substrate.

The abrasive material is chosen such that it is capable of removing the bevel polymer 103 from the edge 101 of substrate 100 without scratching or damaging the surface of the substrate 100. In one embodiment, an abrasive material that has a hardness level greater than the hardness level of the bevel polymer 103 but less than the hardness level of the substrate 100, is used. Keeping the hardness level of the abrasive material greater than the hardness level of the bevel polymer 103 facilitates in the scrubbing and removal of the bevel polymer 103 from substrate edge 101. The hardness level of abrasive material, in this embodiment of the invention, is between about 3 Mohs and about 7 Mohs on the Mohs hardness scale. Examples of abrasive material used in this embodiment include titanium oxide (5.5-6.5 Mohs), zirconium oxide (6.5 Mohs), or amorphous silicon oxide (6.5-7 Mohs), and silicon (7 Mohs). In another embodiment, abrasive materials with hardness level greater than the hardness level of the substrate's surface have been shown to aid in removing bevel polymer without scratching or damaging the surface of the substrate 100. The hardness level of abrasive material, in this embodiment of the invention, is between about 8 Mohs and 9 Mohs on the Mohs hardness scale. Example of abrasive material used in this embodiment include alumina (8-9 Mohs).

Referring to FIG. 3, in an embodiment of the invention, the vanes 201 of the bristle brush unit 200 are configured with an angle of curvature. In one embodiment, the bristle brush unit 200 is rotated around the axis of rotation defined by the rotating shaft 202 in such a way that the direction of rotation of the bristle brush unit 200 is in a direction opposite to the direction of the angle of curvature of the vanes 201. Other rotational directions may be implemented as long as the bristle brush unit is capable of making contact with the edge of the substrate 100 and efficiently cleaning the edge of the substrate 100. It should be appreciated that while the curvature of the vanes 201 and the direction of rotation is specified here, this is not meant to be limiting as any suitable shape of vanes 201 and rotation direction may be applied such that the bevel polymer 103 deposited on the underside surface of the substrate 100 gets cleaned.

As shown in FIG. 3, a fluid distributor channel 301 in the housing 205 introduces cleaning chemistry to the vanes 201. In this embodiment of the invention, the cleaning chemistry is conducted through the fluid distributor channel 301 and introduced into the cavity 210 and sprayed directly onto the vanes 201 when rotating. In another embodiment of the invention, the fluid distributor channel 301 may be part of the rotating shaft 202 and introduce the cleaning chemistry directly into the bristle brush unit 200 and distributed throughout the vanes 201 while rotating. It should be appreciated that the fluid distributor channel 301 can be positioned anywhere in the housing 205 so long as the function of introducing cleaning chemistry to the vanes 201 of the bristle brush unit 200 is met. The cleaning chemistry introduced into the vanes 201 acts as a lubricant on the surface of the substrate and also assists in the breakdown of bevel polymer 103. Continuous exposure to the cleaning chemistry along with the abrasive forces provided by the bristle brush unit 200 breaks down the bevel polymer 103 deposited on the surface of the substrate 100.

Some examples of cleaning chemistries that may be applied to the substrate edge cleaning process of the present embodiment include about 0.049% to about 49% by weight of Hydrogen fluoride to de-ionized water, about 1% to about 50% by weight of Ammonia to de-ionized water or about 1% to about 100% by weight of one or more amines including Triethylamine, Triethanolamine, Hydroxyethylmorpholine, Hydroxylamine, Dimethylformamide, Dimethylacetamide, Methyldiethanolamine, Diglycolamine, Polymethyldiethylenetriamine to de-ionized water. Ammonia solutions may also contain about 0% to about 50% Ammonium Fluoride or about 0% to about 50% Hydrogen Peroxide. The amine solutions may also include about 0% to about 70% of Catechol, about 0% to about 70% Phenol, about 0% to about 50% Ammonium Fluoride or about 0% to about 10% of Iminodiacetic acid.

As shown in FIG. 3, the cavity 210 inside the housing 205 holding the bristle brush unit 200 further includes a lower drainage channel 303 to receive and remove the chemicals and particles from cleaning. The lower drainage channel 303 is located inside the cavity 210 under the bristle brush unit 200 so that the chemicals and particles released during the cleaning process are directed towards an opening of the lower drainage channel 303 and removed. In an embodiment of the invention, the lower drainage channel 303 is positioned in such a way that the opening of the lower drainage channel 303 inside the cavity 210 is under at least a portion of the bristle brush unit 200 so that the chemicals and particles released during the cleaning process are captured and removed. The lower drainage channel 303 is operatively connected to a vacuum source to allow efficient removal of the particles and chemicals. The lower drainage channel 303 can be positioned anywhere in the housing 205 so long as the function of removing chemicals and particles released during the cleaning from under the bristle brush unit 200 is met.

Figure 4A:
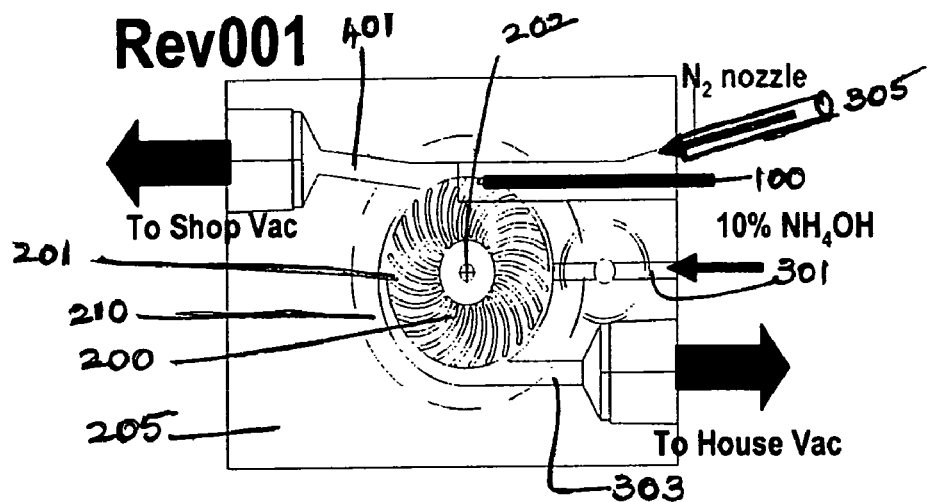
FIG. 4A is a cross-sectional view illustrating a housing with a bristle brush unit contained therein and an upper and a lower drainage channel positioned over and under the bristle brush unit, in accordance with an embodiment of the invention.
Figure 4B:
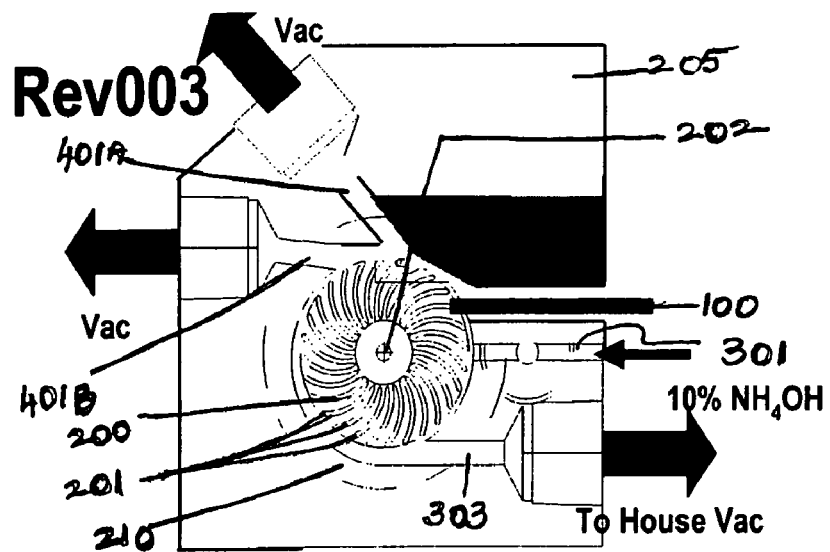
FIG. 4B is an alternative embodiment to FIG. 4A illustrating two upper drainage channels over and a lower drainage channel under the bristle brush unit, in accordance with an embodiment of the invention.

FIGS. 4A and 4B illustrate two variations of a housing with a bristle brush unit 200 contained therein and channels positioned over and under the bristle brush unit. As shown in FIG. 4A, the cavity 210 inside the housing 205 holding the bristle brush unit 200 further includes an upper drainage channel 401 to receive and remove the chemicals and particles released during cleaning. The upper drainage channel 401 is positioned over the bristle brush unit 200 inside the cavity 210 so that the chemicals and particles released during the cleaning process are directed towards an opening of the upper drainage channel 401 and removed. In an embodiment of the invention, the upper drainage channel 401 is located tangentially over the surface of the substrate to direct the particles and chemicals released during cleaning into the opening of the upper drainage channel 401. In another embodiment, the upper drainage channel 401 is located inside the cavity 210 over the bristle brush unit 200 such that the opening of the upper drainage channel 401 inside the cavity 210 is over at least a portion of the bristle brush unit 200. The upper drainage channel 401 is operatively connected to a vacuum source to allow efficient removal of the particles and chemicals. The upper drainage channel 401 can be positioned anywhere in the housing 205 so long as the function of removing the chemicals and particles released during the cleaning process from over the bristle brush unit 200 is met.

FIG. 4B illustrates a variation of the housing in FIG. 4A. As shown in FIG. 4B, a pair of upper drainage channels 401A and 401B are located inside the cavity 210 of the housing 205 and positioned over the bristle brush unit 200 so that the chemicals and particles released during the cleaning process are directed towards an opening in each of the upper drainage channels 401A and 401B and removed. The upper drainage channels 401A and 401B can be positioned anywhere in the housing 205 so long as the function of removing the chemicals and particles released during the cleaning process from over the bristle brush unit 200 is met. Additional upper drainage channels may be used for effective removal of the chemicals and particles from over the bristle brush unit 200.

As illustrated in FIG. 3 and FIG. 4A, in an embodiment of the invention, a nozzle 305 is provided to introduce fluids, such as de-ionized water, or gases, such as gaseous nitrogen, onto a top surface of the substrate 100. The fluids or gases are introduced onto the top surface of the substrate 100 to remove any cleaning chemistry that may make their way on to the top surface of substrate 100 during the cleaning process. In one embodiment, the fluid acts as a fluid curtain to prevent any material from migrating to a top surface of the substrate being cleaned. It should be appreciated that as the substrate is rotating, centrifugal force will assist in the removal of cleaning chemistry from the top surface of the substrate. In an embodiment of the invention, the nozzle 305 maybe used to spray fluids, such as de-ionized water, or gases, such as gaseous nitrogen, onto the top surface of the substrate. Other fluids or gases may also be used to clean the surface of the substrate 100 as long as these fluids or gases are compatible with the top surface of the substrate 100 and the cleaning chemistry used. The nozzle 305 can be placed anywhere in the apparatus so long as it is able to efficiently introduce fluids or gases which assist in the removal of any unwanted chemicals that may make their way onto the top surface of the substrate 100. It should be appreciated that the liquid or gas acting as a curtain will reduce any possibility of a chemical reaction between the top surface of the substrate and the cleaning chemistry, by preventing any migration of unwanted chemicals from the bevel edge to the top surface.

Figure 5:
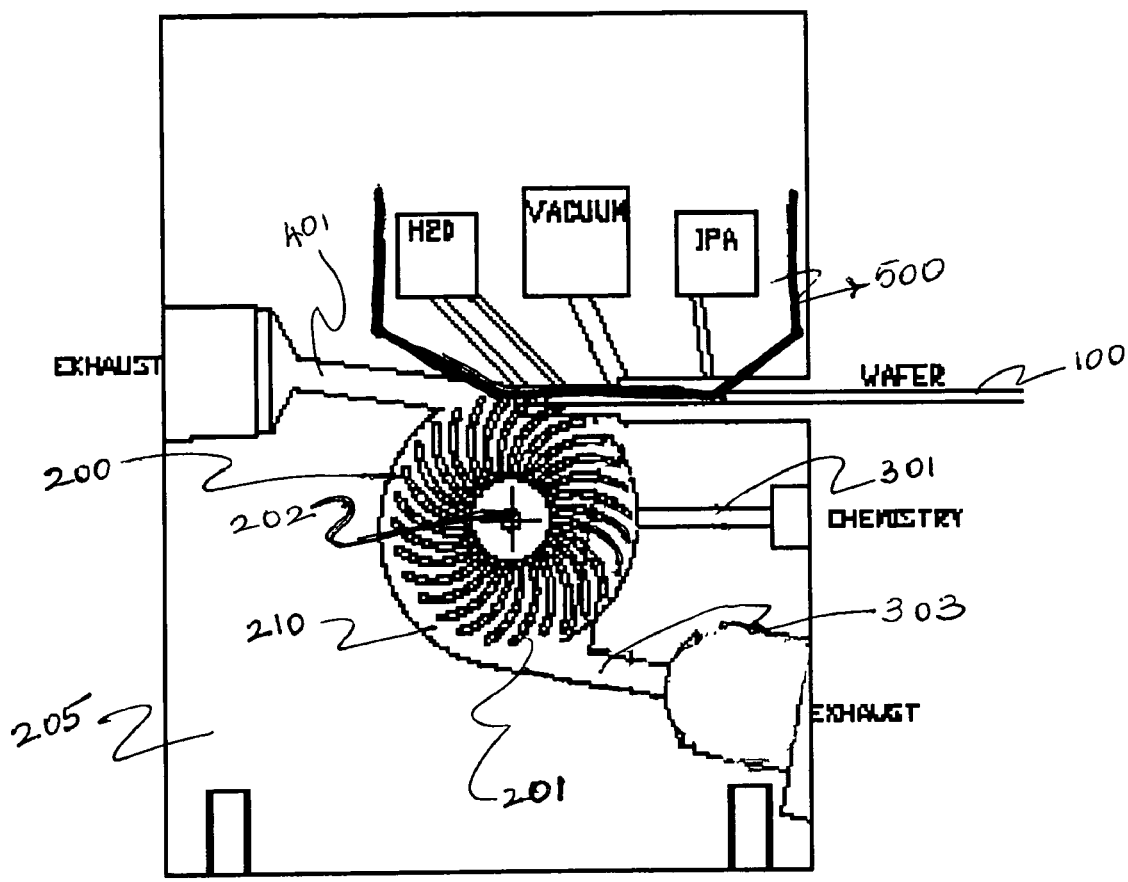
FIG. 5 illustrates a system with proximity head to introduce a liquid meniscus on a top surface of the substrate in accordance with an embodiment of the invention.

An alternative way of reducing the presence of cleaning chemistry on the top surface edge of the substrate 100 is to provide a liquid meniscus barrier at all times during the cleaning process, as illustrated in FIG. 5. FIG. 5 shows the presence of a proximity head 500 over the top surface edge 101 of the substrate 100 in the housing 205 that aids in introducing a liquid meniscus over the immediate top surface edge of the substrate 100. The location of the proximity head 500 is not constrained to the location illustrated in FIG. 5. The proximity head 500 can be located anywhere within the housing 205 so long as it is able to introduce liquid meniscus over the immediate top surface edge of the substrate 100. In another embodiment of the invention, the proximity head 500 can be located to the side of the surface edge of the substrate 100. The liquid meniscus provides a continuous barrier over the immediate top surface of the substrate 100 and prevents any cleaning chemistry or other impurities in the form of particles from reaching the top surface edge of the substrate 100. The meniscus barrier, thus, prevents interaction between the cleaning chemistry and exposed metal lines present on the top of the substrate 100, thereby reducing damage to the top surface of the substrate 100. The proximity head 500 includes the capability to continuously introduce liquid, such as de-ionized water, to form a meniscus. A vacuum source to aid in the formation of the meniscus and an optimal drying agent such as isopropylalcohol are also included. The proximity head 500 has been described in detail in other co-pending application of the assignee, referenced below.

For additional information with respect to the proximity head, reference can be made to an exemplary proximity head, as described in the U.S. Pat. No. 6,616,772, issued on Sep. 9, 2003 and entitled "METHODS FOR WAFER PROXIMITY CLEANING AND DRYING." This U.S. patent application, which is assigned to Lam Research Corporation, the assignee of the subject application, is incorporated herein by reference.

For additional information about top and bottom menisci, reference can be made to the exemplary meniscus, as disclosed in U.S. patent application Ser. No. 10/330,843, filed on Dec. 24, 2002 and entitled "MENISCUS, VACUUM, IPA VAPOR, DRYING MANIFOLD." This U.S. patent application, which is assigned to Lam Research Corporation, the assignee of the subject application, is incorporated herein by reference.

For additional information about menisci, reference can be made to U.S. Pat. No. 6,998,327, issued on Jan. 24, 2005 and entitled "METHODS AND SYSTEMS FOR PROCESSING A SUBSTRATE USING A DYNAMIC LIQUID MENISCUS," and U.S. Pat. No. 6,998,326, issued on Jan. 24, 2005 and entitled "PHOBIC BARRIER MENISCUS SEPARATION AND CONTAINMENT." These U.S. patents, which are assigned to the assignee of the subject application, are incorporated herein by reference in their entirety for all purposes.

For additional information about the proximity vapor clean and dry system, reference can be made to an exemplary system described in the U.S. Pat. No. 6,488,040, issued on Dec. 3, 2002 and entitled "CAPILLARY PROXIMITY HEADS FOR SINGLE WAFER CLEANING AND DRYING." This U.S. patent application, which is assigned to Lam Research Corporation, the assignee of the subject application, is incorporated herein by reference.

Figure 6:
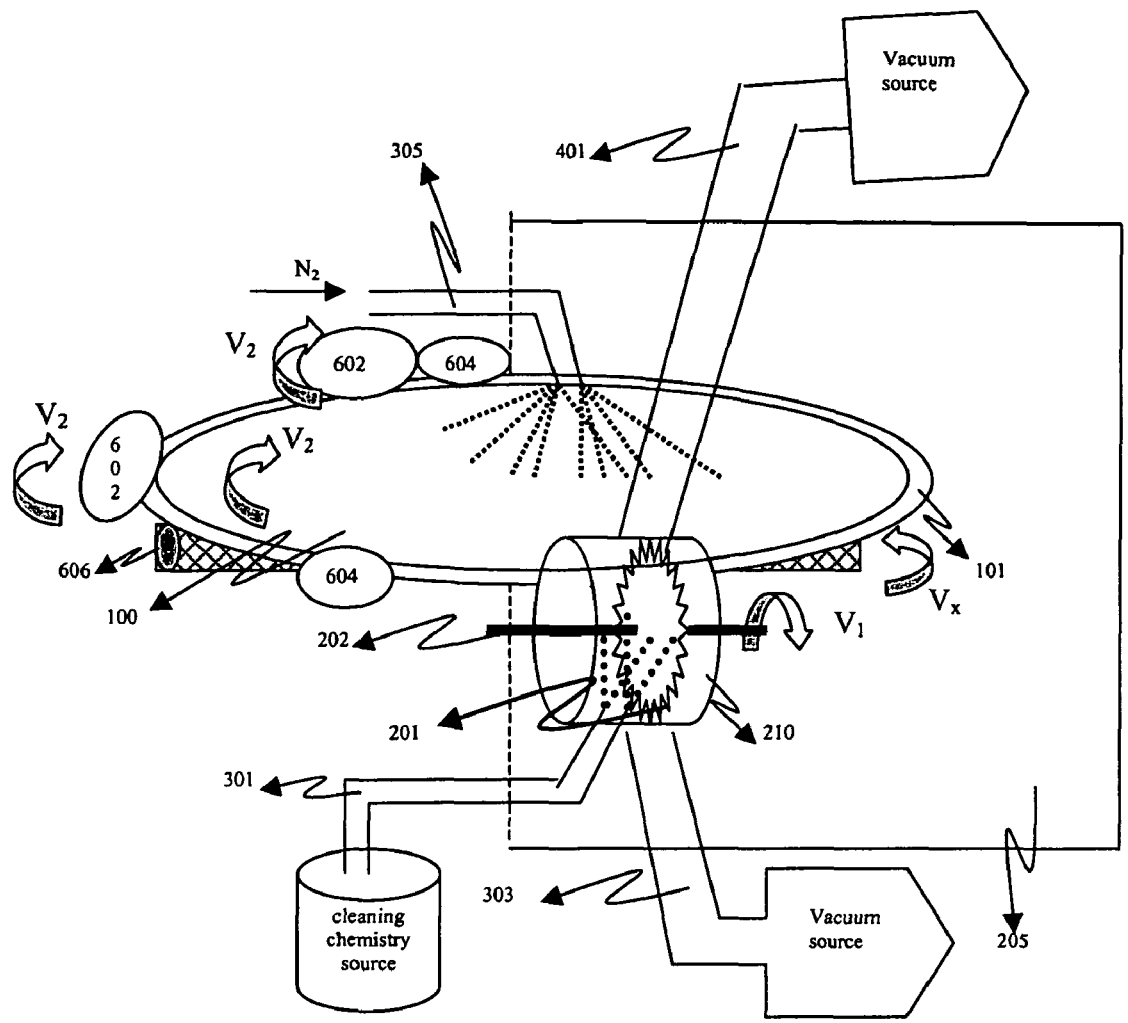
FIG. 6 illustrates a substrate edge cleaning system in accordance with an embodiment of the invention.

FIG. 6 illustrates an edge cleaning system in one embodiment of the invention. The substrate edge cleaning system, as illustrated in FIG. 6, includes a substrate supporting device and a bristle brush applicator. The supporting device is provided to receive and support the substrate on a selected plane. The substrate supporting device includes a pair of drive rollers 602 distributed along the circumference of the substrate 100 to receive the edge 101 of the substrate 100, in one embodiment of the invention. These drive rollers 602 fit the profile of the substrate edge 101 and assist in spinning the substrate 100 around to expose different areas of the substrate edge 101 to the bristle brush unit 200. Different configurations and positions for the drive rollers 602 are possible. The drive rollers 602 and the substrate 100 could be rotated along their axes by use of a motor (not shown) or by other mechanical means.

The substrate supporting device also includes one or more stabilizer wheels 604 distributed along the circumference of the substrate 100, to stabilize the substrate 100 along the selected plane of rotation during the cleaning process. In this embodiment, a pair of stabilizer wheels 604 has been used. Different configurations and positions for the stabilizer wheels 604 are possible as long as the stabilizer wheels 604 are able to stabilize and maintain the substrate 100 in the selected plane of rotation, during the cleaning process.

A bristle brush applicator is provided to the underside of the substrate 100. The bristle brush applicator includes a housing 205 and a bristle brush unit 200 inside a cavity 210 in the housing 205. As mentioned earlier, the bristle brush unit 200 is made up of a plurality of outwardly extending vanes 201 and mounted on a rotating shaft 202 so that the vanes 201 of the bristle brush unit 200 are in contact with the edge 101 of the substrate 100. It should be noted that the bristle brush unit 200 is configured within the housing 205 such that the bristle brush unit 200 can be removed and replaced with a newer and fresher bristle brush unit 200.

A fluid distributor channel 301 introduces cleaning chemistry into the vanes 201 of the bristle brush unit 200. In one embodiment, a nozzle 305, to spray or introduce fluids, such as de-ionized water, or gases, such as gaseous Nitrogen, onto the top surface of the substrate 100, is provided within the housing 205. The nozzle 305 is capable of varying the pressure of gases or fluids introduced over the top surface of the substrate 100. Alternatively, in another embodiment of the invention, a proximity head 500 to introduce liquid meniscus layer over the immediate top surface edge of the substrate 100 is provided. An upper drainage channel 401 positioned over the bristle brush unit 200 and a lower drainage channel 303 positioned under the bristle brush unit 200 and each connected to a vacuum source assist in removing the cleaning chemistry and particles released during the cleaning process from over and under the bristle brush unit 200.

Optionally, an underside roller brush 606 is placed in contact with the underside of the substrate 100 to assist in the removal of cleaning chemistry and particles from the underside of the substrate 100. The underside roller brush 606 is made of a porous material such as PVA. The underside roller brush 606 is rotated around its axis along the under surface of the substrate 100 using a motor (not shown) or some other mechanical means, to assist in the removal of chemicals and particles that settle on the under surface of the substrate 100. The rotational speed of the underside roller brush 606 can be varied to provide for efficient cleaning of the underside of the substrate 100. Cleaning chemistry maybe introduced into the underside roller brush 606 using a fluid distributor channel through the underside roller brush 606. The cleaning chemistry provides the lubrication and assists in the chemical break-down of particles that settle on the underside of the substrate 100.

A method to clean an edge 101 of a substrate 100 is explained in great detail in one embodiment, with reference to the system illustrated in FIG. 6. In this embodiment, the substrate is received and supported on a supporting device and a bristle brush applicator is applied to the edge 101 of the substrate 100. The bristle brush applicator includes a housing 205, to receive the edge 101 of the substrate 100 in a particular plane. The housing also includes a cavity 210 within which a bristle brush unit 200 with outwardly extending vanes (vanes) 201 is received. The bristle brush unit 200 is mounted on a rotating shaft 202 such that the vanes 201 are in contact with the edge 101 of the substrate 100 when the bristle brush applicator is applied to the edge 101 of the substrate 100.

The supporting device includes a pair of stabilizer wheels 604 to support the substrate 100 along a selected plane. A pair of drive rollers 602 receives the edge 101 of the substrate 100 and rotates the substrate 100 along the selected plane. A nozzle 305 to spray or introduce fluid or gas onto the top surface of the substrate 100 or a proximity head to introduce a liquid meniscus to the immediate top surface of the substrate is provided. Cleaning chemistry is applied to the vanes 201 of the bristle brush unit 200 through a fluid distributor channel 301. Applying the cleaning chemistry to the vanes 201 includes introducing the cleaning chemistry through the fluid distributor channel 301 and spraying the cleaning chemistry directly onto the vanes 201 of the bristle brush unit 200. An alternate way of applying cleaning chemistry to the vanes 201 is by conducting the cleaning chemistry through the fluid distributor channel 301 into the bristle brush unit 200 directly and then distributing it throughout the vanes 201. The cleaning chemistry assists in lubricating the surface of the substrate 100 and in breaking-down the bevel polymer 103 deposited on the edge of the substrate 100.

During the cleaning process, the bristle brush unit 200 is rotated along its axis at a velocity v1 with the vanes 201 making contact with the edge of the substrate 100 which is rotating at a velocity v2 along the substrate's selected plane of rotation. In this embodiment of the invention, the bristle brush unit's axis of rotation is perpendicular to the surface of the substrate 100. The stabilizer wheels 604 keep the substrate 100 steady along the selected plane of rotation and drive rollers 602 provide the force for the substrate 100 to rotate along the selected plane. The rotation of substrate 100, bristle brush unit 200, drive rollers 602 can be achieved by use of one or more motors (not shown) or by any other mechanical means.

The cleaning chemistry in the vanes 201 of the bristle brush unit 200 interfaces with the edge 101 of the substrate 100 providing the lubrication to the surface of substrate 100. Simultaneously, the cleaning chemistry interacts with the bevel polymer 103 on the edge of substrate 100 to cut the bond binding the bevel polymer 103 to the edge 101 of substrate 100. An abrasive material distributed in the vanes 201 of the bristle brush unit 200 exposed to the edge 101 of the substrate 100 contact the edge of the substrate 100 during rotation and simultaneously works to cut and tear the bevel polymer 103 from the edge 101 of substrate 100. Continuous exposure to cleaning chemistry weakens the bond binding the bevel polymer 103 to the edge 101 of substrate 100 and the continuous frictional contact of the abrasive material exposed to the edge 101 of the substrate 100 abrades the bevel polymer 103 from the edge 101 of substrate 100 resulting in a substantially or completely bevel-polymer-free substrate edge 101. The torn bevel polymer 103 along with any cleaning chemistry released during the cleaning process are directed towards the upper and lower drainage channels and suctioned out of the housing 205.

Referring to FIG. 6, a nozzle 305 is provided to introduce fluids, such as de-ionized water, or gases, such as gaseous nitrogen, using variable pressure onto the top surface of the substrate 100. The fluids or gases introduced using variable pressure further assist in creating a barrier for the cleaning chemistry and other particle debris thereby preventing the cleaning chemistry and particles from reaching the top surface of the substrate and chemically reacting with the metal lines on the top surface of the substrate 100. Alternatively, a liquid meniscus is introduced through a proximity head onto the immediate top surface of the substrate 100 creating a liquid barrier. The liquid meniscus prevents any cleaning chemistry and particle debris released during the cleaning process to reach the top surface of the substrate 100.

The material used to make the bristle brush unit 200, including the vanes 201, maybe porous and formed from materials such as nylon. The abrasive material used in this embodiment are selected from a group consisting of titanium oxide, zirconium oxide, amorphous silicon oxide, silicon and alumina. The cleaning chemistry that may be applied to the substrate include about 0.049% to about 49% by weight of Hydrogen fluoride to de-ionized water, about 1% to about 50% by weight of Ammonia to de-ionized water or about 1% to about 100% by weight of one or more amines including Triethylamine, Triethanolamine, Hydroxyethylmorpholine, Hydroxylamine, Dimethylformamide, Dimethylacetamide, Methyldiethanolamine, Diglycolamine, Polymethyldiethylenetriamine to de-ionized water. Ammonia solutions may also contain about 0% to about 50% Ammonium Fluoride or about 0% to about 50% Hydrogen Peroxide. The amine solutions may also include about 0% to about 70% of Catechol, about 0% to about 70% Phenol, about 0% to about 50% Ammonium Fluoride or about 0% to about 10% of Iminodiacetic acid. The housing 205 may be made of a chemically resistant material such as PolyVinylidine DiFluoride (commonly marketed as KYNAR), Polytetrafluoroethylene (commonly marketed as TEFLON), Polypropolene, Polyethylene Terephthalate (PET), polyvinyl chloride (PVC), Acrylic, Polyetheretherketone (PEEK), Delrin, Acetal, or Polyphenylene Sulfide (PPS).

The velocity of the bristle brush unit v1 in one embodiment illustrated in FIG. 6 is between about 5000 rotations per minute (rpm) to about 20,000 rpm and the velocity of the substrate v2 along the plane of rotation of the substrate 100 is between about 1 rpm to 20 rpm. The flow rate resulting from the vacuum source in one embodiment of the invention is about 90 standard liters per minute (slm).

In an alternate embodiment, the substrate 100 is subjected to a cleaning cycle that includes a series of cleaning steps. The system used in this embodiment is similar to the system illustrated in FIG. 6. In the first step of the cleaning process in this embodiment, a trimmed underside roller brush 606 is used to remove bevel polymer 103 that was deposited on the under side of the substrate during fabrication process. In this step, the underside roller brush 606 is rotated at a velocity relative to the velocity at which the substrate is rotated along the substrate's axis of rotation and applied along the underside surface of the substrate 100. The underside roller brush 606 helps in removing the bevel polymer 103, chemicals and particles that may have settled on the underside of the substrate 100 during fabrication and cleaning process. The underside roller brush 606 is made of a porous material similar to the bristle brush unit 200 explained earlier.

In the second step, the substrate is exposed to the bristle brush unit 200 rotating at about 10,000 rotations per minute. As explained earlier, the bristle brush unit 200 in this embodiment, including the vanes 201, is made of porous material to enable distribution of cleaning chemistry throughout the bristle brush unit 200. The cleaning chemistry in the bristle brush unit 200 provides the lubrication to the substrate during the cleaning process. The bristle brush unit 200 works on the bevel polymer 103 deposited in the notch and backside edge of the substrate 100, cuts and releases the bevel polymer 103 from the edge and notch of the substrate 100. The released bevel polymer, cleaning chemistry and other particles are removed by the upper drainage channel 401 and lower drainage channel 303 provided within the system.

In the next step, the substrate 100 is then subjected to cleaning using a porous polyurethane impregnated polyester polishing pads such as commercially available SUBA pads from Rodel, Inc. The porosity of the polishing pad enables distribution of cleaning chemistry such as Ammonium Hydroxide throughout the polishing pad. The cleaning chemistry provides the lubrication to the surface of the substrate during the cleaning process and further helps in breaking down the bevel polymer 103 deposited along the edge of the substrate.

The final step in this cleaning cycle is to remove the chemicals and particles, including bevel polymers 103, released during the cleaning process. The chemicals and particles are removed from the surface of the substrate using the confinement step. In one embodiment, the chemicals and particles are confined to the underside and edge of the substrate and removed as soon as they are released using an upper drainage channel 401 and lower drainage channel 303 each connected to an external vacuum source. The vacuum source helps in suctioning the chemicals and particles. In this embodiment, the top surface of the substrate is kept dry. The strength of vacuum source can be adjusted depending on the cleaning requirements and on the chemicals and particles released during the cleaning process.

In an alternative embodiment, a barrier such as gaseous nitrogen or de-ionized water or a liquid meniscus is introduced to the immediate top surface of the substrate. This acts as a curtain and prevents the chemicals and particles released during the cleaning process from making their way to the top surface of the substrate 100. At the end of this cleaning cycle, the substrate 100 is substantially clean.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. An apparatus to clean a portion of an edge of a semiconductor substrate, comprising:
    a housing configured to receive the edge of the semiconductor substrate, the housing having a cavity defined within such that the cavity is enclosed by the housing, the cavity in the housing having an opening such that only the portion of the semiconductor surface received through the housing extends into the cavity;
    a proximity head located inside the cavity in the housing, the proximity head configured to introduce a meniscus barrier on an outer edge located at a top surface of the portion of the semiconductor substrate extending inside the cavity;
    a bristle brush unit located inside the cavity in the housing, the bristle brush unit having a plurality of outwardly extending vanes, the bristle brush unit mounted on a rotating shaft and aligned so that the outwardly extending vanes contact an underside of the portion of the edge of the semiconductor substrate extending into the cavity when rotating, wherein the outwardly extending vanes are made from a porous material; and
    a fluid distributor channel within the cavity of the housing, the fluid distributor channel configured to introduce cleaning chemistry to the plurality of outwardly extending vanes of the bristle brush unit, the cleaning chemistry providing lubrication during cleaning of the underside of the portion of the edge of the semiconductor substrate.

2. The apparatus to clean a portion of an edge of a semiconductor substrate as recited in claim 1, wherein the cavity in the housing further comprises:
    an upper drainage channel positioned over the bristle brush unit.

3. The apparatus to clean a portion of an edge of a semiconductor substrate as recited in claim 1, wherein the housing is made of chemically resistant materials selected from a group consisting of PolyVinylidine DiFluoride, Polytetrafluoroethylene, Polypropolene, Polyethylene Terephthalate, polyvinyl chloride, Acrylic, Polyetheretherketone, Delrin, Acetal, or Polyphenylene Sulfide.

4. The apparatus to clean a portion of an edge of a semiconductor substrate as recited in claim 1, wherein the porous material is nylon with impregnated micron alumina.

5. The apparatus to clean a portion of an edge of a semiconductor substrate as recited in claim 1, wherein an abrasive material is distributed throughout and within the outwardly extending vanes of the bristle brush unit, the abrasive material chosen to prevent scratching or damaging of the semiconductor substrate.

6. The apparatus to clean a portion of an edge of a semiconductor substrate as recited in claim 5, wherein the abrasive material is selected from a group consisting of titanium oxide, zirconium oxide, amorphous silicon oxide, silicon and alumina.

7. The apparatus to clean a portion of an edge of a semiconductor substrate as recited in claim 6, wherein the abrasive material has a hardness level greater than a hardness level of a bevel polymer built-up on the edge of the semiconductor substrate.

8. The apparatus to clean a portion of an edge of a semiconductor substrate as recited in claim 1, wherein the plurality of vanes have an angle of curvature directed in an opposite direction to a direction of rotation of the bristle brush unit.

9. The apparatus to clean a portion of an edge of a semiconductor substrate as recited in claim 1, wherein the cavity in the housing further comprises:
    a lower drainage channel defined under the bristle brush unit.

10. The apparatus to clean a portion of an edge of a semiconductor substrate as recited in claim 1, wherein the cavity in the housing further comprises:
    a plurality of bristle brush units, each bristle brush unit having a plurality of outwardly extending vanes, the plurality of bristle brush units mounted on the rotating shaft and aligned so that each outwardly extending vane contacts the underside of the portion of the edge of the semiconductor substrate extending into the cavity when rotating.

11. The apparatus to clean a portion of an edge of a semiconductor substrate as recited in claim 1, wherein the bristle brush unit is an interchangeable unit.

12. A system to clean a portion of an edge of a semiconductor substrate, comprising:
    a substrate supporting device supporting the semiconductor substrate; and
    a bristle brush applicator including
        a housing configured to receive the edge of the semiconductor substrate, the housing having a cavity defined within such that the cavity is enclosed by the housing, the cavity in the housing having an opening such that only a selected portion of the semiconductor surface received through the housing extends into the cavity,
        a proximity head located inside the cavity in the housing, the proximity head configured to introduce a meniscus barrier on an outer edge located at a top surface of the selected portion of the semiconductor surface extending inside the cavity;
        a bristle brush unit located inside the cavity in the housing, the bristle brush unit having a plurality of outwardly extending vanes, the bristle brush unit mounted on a rotating shaft and aligned such that the outwardly extending vanes contact an underside of the portion of the edge of the semiconductor substrate extending into the cavity when rotating, wherein the outwardly extending vanes are made from a porous material; and
        a fluid distributor channel within the cavity of the housing, the fluid distributor channel configured to introduce cleaning chemistry to the plurality of outwardly extending vanes of the bristle brush unit, the cleaning chemistry providing lubrication during cleaning underside of the portion of the edge of the semiconductor substrate.

13. The system to clean a portion of an edge of a semiconductor substrate as recited in claim 12, wherein the cavity in the housing further includes:

an upper drainage channel positioned over the bristle brush unit, the channel connected to a vacuum source to remove chemicals and particles released during cleaning.

14. The system to clean a portion of an edge of a semiconductor substrate as recited in claim 12, wherein the cavity in the housing further comprises:

a lower drainage channel defined under the bristle brush unit, the drain channel connected to a vacuum source to remove chemicals and particles released during cleaning.

* * * * *